United States Patent
Shimizu

(10) Patent No.: US 6,510,316 B2
(45) Date of Patent: Jan. 21, 2003

(54) WIRELESS COMMUNICATION APPARATUS

(75) Inventor: Tomoyasu Shimizu, Sagamihara (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/541,589

(22) Filed: Apr. 3, 2000

(65) Prior Publication Data

US 2002/0068553 A1 Jun. 6, 2002

(30) Foreign Application Priority Data

Apr. 1, 1999 (JP) .......................................... 11-094933

(51) Int. Cl.⁷ ................................................ H04M 3/00
(52) U.S. Cl. ...................... 455/418; 455/419; 455/575; 455/412; 711/103; 711/153; 711/173
(58) Field of Search ................................ 455/418, 419, 455/412, 422, 426, 435, 575; 711/103, 153, 173

(56) References Cited

U.S. PATENT DOCUMENTS

| | | | | |
|---|---|---|---|---|
| 4,876,738 A | * | 10/1989 | Selby ........................... | 455/33 |
| 5,210,854 A | * | 5/1993 | Beaverton et al. ........... | 395/500 |
| 5,937,434 A | * | 8/1999 | Hasbun et al. ............... | 711/170 |
| 5,946,615 A | * | 8/1999 | Holmes et al. ............... | 455/412 |
| 5,978,672 A | * | 11/1999 | Hartmaier et al. ........... | 455/413 |
| 6,009,497 A | * | 12/1999 | Wells et al. ................. | 711/103 |
| 6,044,265 A | * | 3/2000 | Roach, Jr. .................... | 455/419 |
| 6,122,503 A | * | 9/2000 | Daly ........................... | 455/419 |

FOREIGN PATENT DOCUMENTS

| | | |
|---|---|---|
| JP | 6-124596 | 5/1994 |
| JP | 7-319752 | 12/1995 |
| JP | 8-195975 | 7/1996 |
| JP | 9-97206 | 4/1997 |

OTHER PUBLICATIONS

Japanese Examination Report dated Aug. 20, 2002, along with an English translation.

* cited by examiner

*Primary Examiner*—Edward F. Urban
*Assistant Examiner*—Marleau Milord
(74) *Attorney, Agent, or Firm*—Ostrolenk, Faber, Gerb & Soffen, LLP

(57) ABSTRACT

The wireless communication apparatus has a flash memory in which a plurality of sectors are formed to make partitions so that at least two of the sectors are allocated for storing the positional record information. The positional-record information is stored in one of the at least two allocated sectors, whereas at least one of the remaining sectors are controlled so as to be used as an empty sector storing no information. When positional-record information for updating is given, the information is updated and stored in at least one of the remaining sectors, that is, in the aforementioned empty sector. After updating and storing of the information is completed, the information stored in the sector storing the pre-update positional-record information is eliminated. Although it takes a long time to eliminate the information stored in the sector, the above arrangement does not require the processing of eliminating the information during the period between the starting of updating the positional-record information and the completion of updating and storing the information in the flash memory. As a result, the time required for updating the positional-record information can be reduced.

8 Claims, 4 Drawing Sheets

WIRELESS COMMUNICATION APPARATUS

BACKGROUND OF THE INVENTION

1. Field of the Invention

The present invention relates to wireless communication apparatuses such as the Personal Handy Phone System (PHS) and cellular phones.

2. Description of the Related Art

It is known that information including positional-record information and area information based on the unified standards of the Association of Radio Industries and Businesses (ARIB) is provided to wireless portable communication apparatuses such as the PHS and a mobile telephone through wireless communications between a base station and the apparatuses. The positional-record information and area information are, for example, stored in a flash memory 2 contained in a wireless communication apparatus 1 shown in FIG. 4.

The flash memory 2 described above is a non-volatile memory, and for example, includes a program-storing region 2a for storing a communication program of the wireless communication apparatus 1 and a data-storing region 2b for storing data as information. In the data-storing region 2b, a plurality of sectors 3 is formed to be partitioned for storing one or more pieces of information. One of the sectors 3, for example, a sector 3a, stores the aforementioned positional-record information.

When a user carries the wireless communication apparatus 1 with him, and the communication area corresponding to the apparatus 1 changes, an operation for recording the new position is performed. In order to record the new position, the positional-record information concerning the new communication area obtained after moving from the previous position is transmitted to the wireless communication apparatus 1 from a base station in order to update the apparatus 1. Then, the wireless communication apparatus 1 stores and updates the received positional-record information. In other words, the wireless communication apparatus 1 receives the positional-record information via an antenna 5, and passes the received information through a radio-frequency unit (RFU) 6 and a base band integrated circuit (BBIC) 7 in sequence to transmit to a control unit (CPU) 8. After this, the CPU 8 updates the positional-record information of the flash memory 2 with the received update information.

However, because of the nature of a flash memory, all the information stored in every sector is eliminated when the flash memory 2 is updated. Therefore, it is impossible to eliminate only the positional-record information stored in the sector 3a among the plurality of items of information stored in the aforementioned flash memory 2. Furthermore, in the conventional apparatus 1, only the one sector 3a is allocated for storing the positional-record information, as described above. Consequently, it takes excessive time to complete updating of the positional-record information after the updating operation is started.

As a result, under the condition in which only the one sector 3a is used for storing the positional-record information, updating of the positional-record information must be performed by the following steps.

According to a first example, when the positional-record information for updating is given to the CPU 8, the CPU 8 first reads out all the stored information from the flash memory 2, including the positional-record information from the sector 3a, and writes or copies the read-out information in a RAM 10.

In the RAM 10, based on the updated positional-record information, the CPU 8 modifies the content of the positional-record information included in the information copied from the sector 3a, which is hereinafter referred to as the copied information from the sector 3a, to create modified positional-record information. Meanwhile, after the information stored in the sector 3a has been copied in the RAM 10, as described above, the CPU 8 eliminates all the information stored in the sector 3a of the flash memory 2.

Then, when the sector 3a becomes empty after elimination of the information stored in the sector 3a is completed, the CPU 8 stores the modified positional-record information modified in the RAM 10 into the sector 3a, with the result that updating of the positional-record information is completed.

Following is another example of a process for updating the positional-record information. First, when the positional-record information for updating is given to the CPU 8, in the very first step, only when there is no copied information from the sector 3a in the RAM 10, the CPU 8, as described above, reads out all the stored information including the positional-record information from the sector 3a, and copies the read-out information in the RAM 10. Then, as in the first example described above, the CPU 8 performs updating of the positional-record information.

However, after the updating of the positional-record information in the flash memory 2 has been completed, the copied information of the sector 3a in the RAM 10 and the stored information of the sector 3a in the flash memory 2 are the same. Therefore, in this case it is unnecessary to copy the positional-record information stored in the sector 3a into the RAM 10. Instead, when the positional-record information for updating is given to the CPU 8, the CPU 8, from the beginning, updates the positional-record information among the information copied from the sector 3a already stored in the RAM 10, based on the given updated positional-record information, and similarly, updates the positional-record information of the flash memory 2, without first reading out the stored information from the sector 3a to copy in the RAM 10.

As described above, in the conventional wireless communication apparatus, by the time updating and storing of the positional-record information for updating in the sector 3a of the flash memory 2 is completed after starting of updating thereof, the stored information of the sector 3a of the flash memory 2 must be eliminated without fail. Since it takes a long time to eliminate the stored information of the sector 3a, it is necessary to take plenty of time during the period between the start of updating the information and the completion thereof. However, this is inconvenient for the user of the apparatus, since the CPU 8 cannot perform any other processing during such a time-consuming operation for updating the positional-record information.

SUMMARY OF THE INVENTION

Accordingly, it is an object of the present invention to solve the above problems and provide a wireless communication apparatus capable of reducing time required for updating updatable information such as positional-record information and area information.

To this end, according to an aspect of the present invention, there is provided a wireless communication apparatus including: (1) a non-volatile flash memory in which a plurality of sectors capable of storing one or more pieces of information are formed to be partitioned, the flash memory eliminating the information stored in every sector; (2) a sector controlling unit for controlling the 4 sectors in such a manner that at least one of the plurality of the sectors stores updatable information, and at least one of the remaining sectors has no information so that the sector becomes empty; (3) an update controlling unit for updating and storing the updatable information in a specified empty sector of the plurality of the sectors after receiving a command for updating the updatable information; and (4) an information-elimination controlling unit for eliminating the information stored in the sector storing the pre-update information based on a command given from the sector controlling unit so as to make the sector empty after updating and storing of the updatable information is completed.

In addition, the above wireless communication apparatus, may further include: (1) an information reading unit for reading out all the information stored in the sector having the updatable information as an object targeted for updating, based on the command from the update controlling unit, when the command for updating the updatable information is received; (2) an information modifying unit for modifying the read-out updatable information; and (3) an information writing unit for updating and storing all the information including the modified updatable information stored in the sector in a specified empty sector of the plurality of sectors.

In addition, in the wireless communication apparatus described above, the updatable information may be one of positional-record information and area information concerning the wireless communication apparatus.

Furthermore, in the wireless communication apparatus described above, the information-elimination control unit may eliminate the information stored in the sector targeted for information elimination during an idle period in which the wireless communication apparatus is not performing information processing.

In the wireless communication apparatus described above, by the sector controlling unit, in addition to the sector for storing updatable information, the empty sector for updating/storing the updatable information for updating is provided. With this arrangement, for example, when a command for updating updatable information such as positional-record information is given, the update controlling unit updates/stores the updatable information for updating in the empty sector without performing the time-consuming elimination of the stored information of the sector.

In this way, according to the wireless communication apparatus of the present invention, it is not necessary to eliminate the information stored in the sector by the time updating and storing of the updatable information in the flash memory is completed after receiving the command for updating the updatable information. This arrangement permits time necessary for updating the updatable information to be greatly reduced.

DESCRIPTION OF THE PREFERRED EMBODIMENTS

A description will be given of the embodiments of the present invention with reference to the drawings.

Figure 1:
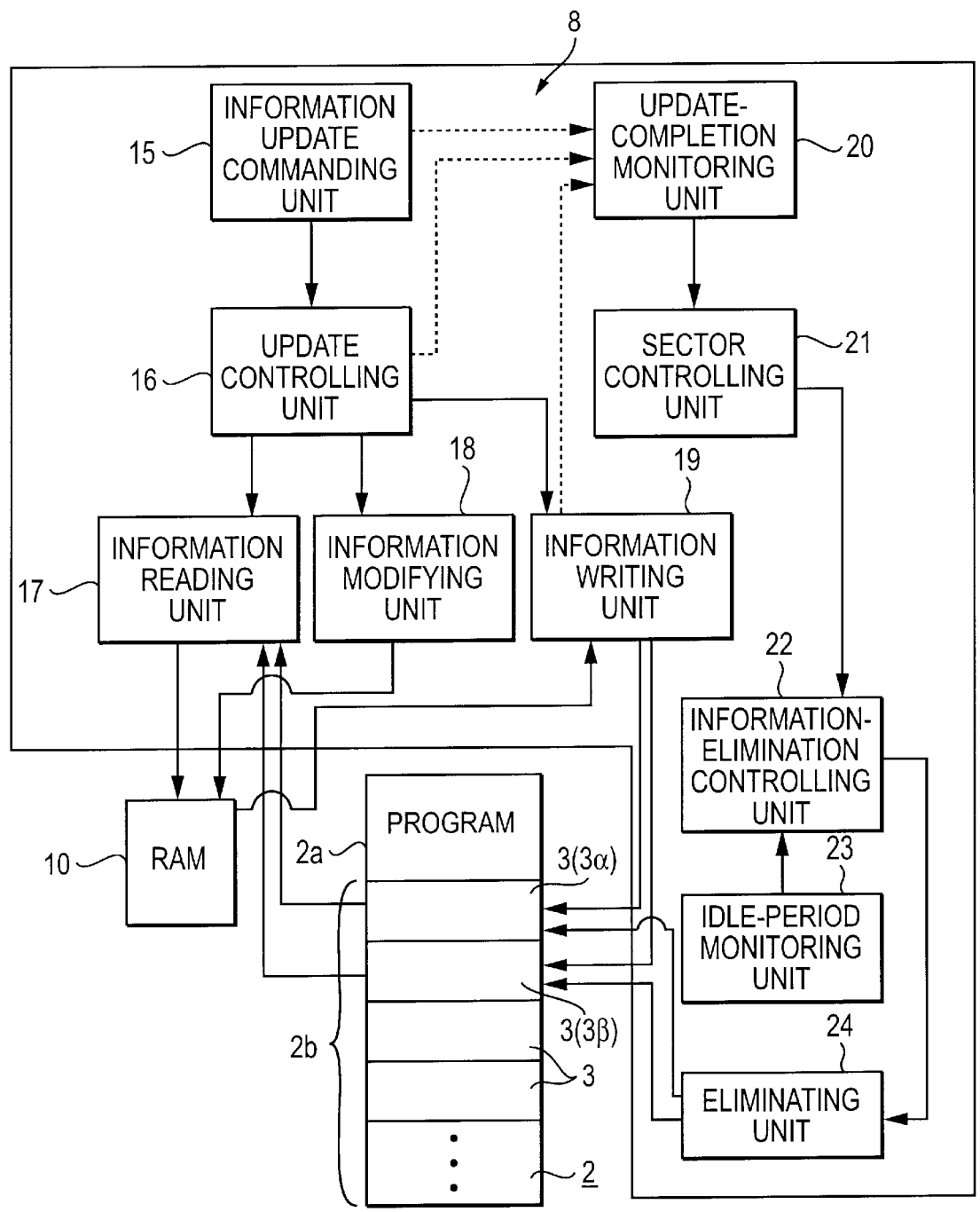
FIG. 1 is a block diagram of the distinctive control structure of a wireless communication apparatus according to a first embodiment of the present invention.
Figure 4:
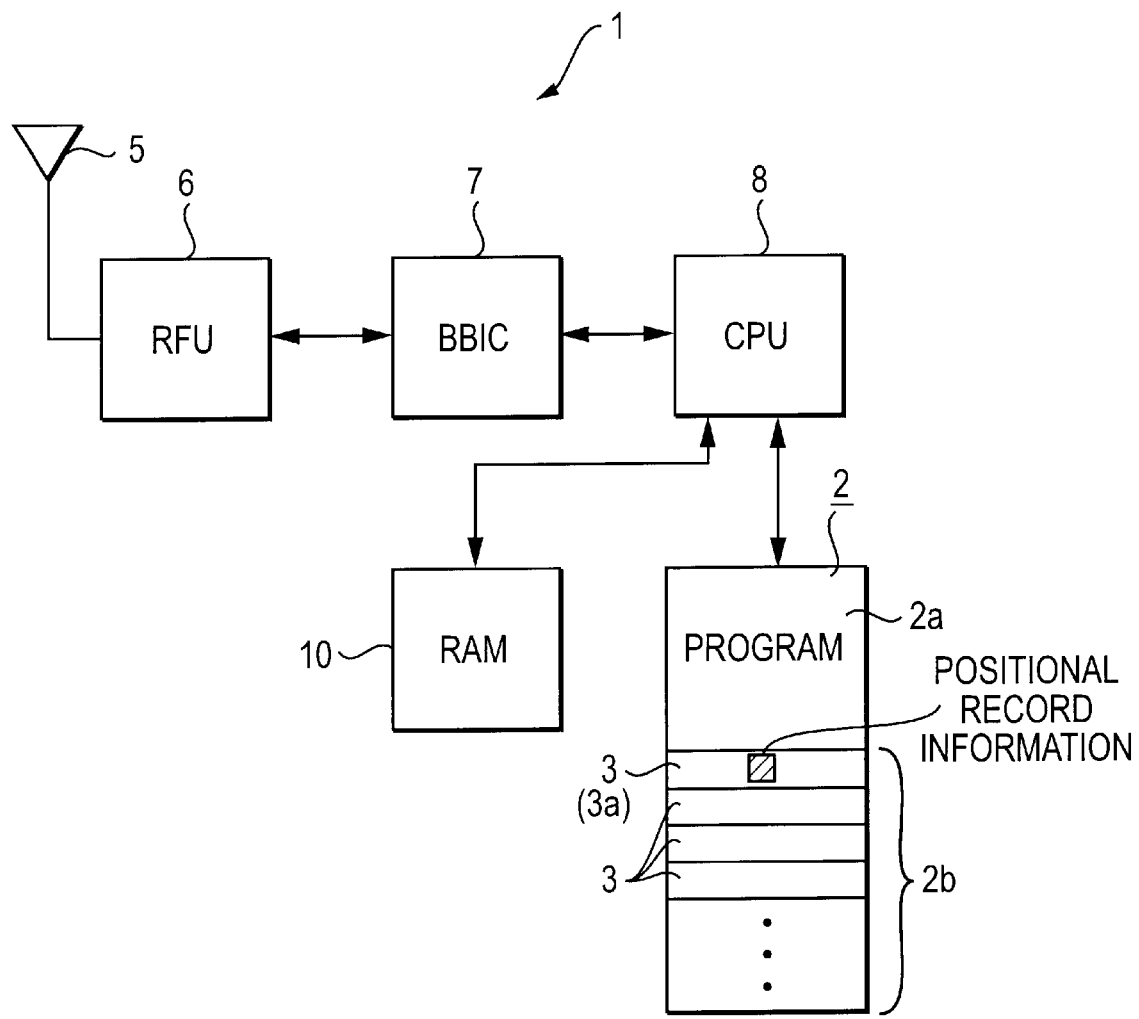
FIG. 4 is a block diagram exemplifying the main structure of a conventional wireless communication apparatus.

FIG. 1 shows a block diagram of the distinctive control structure of a wireless communication apparatus according to a first embodiment of the present invention. Regarding reference numerals shown in FIG. 1, the same structural parts as those of the wireless communication apparatus shown in FIG. 4 have the same reference numerals, and the explanation thereof is omitted.

The first embodiment provides a distinctive arrangement in terms of updating and storing of positional-record information as updatable information to be stored in a flash memory 2 and elimination of the pre-update positional-record information. That is, the flash memory 2 includes a plurality of sectors 3 formed to be partitioned. In the first embodiment, among the plurality of sectors, two sectors $3\alpha$ and $3\beta$ shown in FIG. 1 are allocated as sectors capable of storing the positional-record information. The sectors are controlled in such a manner that one of the sectors $3\alpha$ and $3\beta$ stores the positional-record information, whereas the remaining sector stores no information so that the sector is empty. In such an arrangement for controlling the sectors, when a command for updating the positional-record information is given, the positional-record information used for updating is updated and stored in the empty sector, and after completion of the updating processing, all the information of the sector storing the pre-update positional-record information is eliminated so as to make the sector empty.

The following example shows a detailed control structure, in which the positional-record information is updated and stored in the flash memory 2 and. the pre-update positional-record information is eliminated. For example, as shown in FIG. 1, the CPU 8 includes an information-update commanding unit 15, an update controlling unit 16, an information reading unit 17, an information modifying unit 18, an information writing unit 19, an update-completion monitoring unit 20, a sector controlling unit 21, an information-elimination controlling unit 22, an idle-period monitoring unit 23, and an eliminating unit 24.

When the information-update commanding unit 15 detects that the positional-record information for updating is given to the CPU 8, the CPU 8 gives a command for updating the positional-record information to the update controlling unit 16. The update controlling unit 16 receives the command for updating the positional-record information and gives commands according to the pre-determined controlling procedures to the information reading unit 17, the information modifying unit 18, and the information writing unit 19, respectively, so as to control the operations of these three units 17, 18, and 19, by which the operation for updating of the positional-record information is controlled as follows.

For example, the information reading unit 17 receives a command for reading out information sent from the update controlling unit 16 to read out all the information stored in the sector 3 storing the positional-record information, as one of the sectors $3\alpha$ and $3\beta$ of the flash memory 2. In this case, in order to facilitate understanding, for example, the sector $3\alpha$ is allocated for storing the positional-record information. The information read out by the information reading unit 17 is written or copied into a RAM 10.

The information modifying unit 18 modifies the positional-record information among all the information of the sector $3\alpha$ copied in the RAM 10 by the information reading unit 17 into positional-record information for updating. Unlike the flash memory 2, it is possible to modify only the positional-record information among the copied information of the sector 3α in the RAM 10.

After the information modifying unit 18 modifies the positional-record information of the RAM 10, the information writing unit 19 reads out the copied information of the sector 3α including the modified positional-record information from the RAM 10. Then, the unit information writing 19 updates and stores all the read-out copied information in a sector designated as an empty sector of the sectors 3α and 3β. In this situation, the sector 3β is designated as the empty sector.

In this way, the positional-record information is updated by the information-update commanding unit 15, the update controlling unit 16, the information reading unit 17, the information modifying unit 18, and the information writing unit 19.

The update-completion monitoring unit 20 takes in operational information concerning one or more units among the information-update commanding unit 15, the update controlling unit 16, and the information writing unit 19. Based on the taken-in information, the update-completion monitoring unit 20 monitors whether or not the updating of the positional-record information is completed according to the updating command after a command for updating the positional-record information is given. That is, the update-completion monitoring unit 20 monitors whether or not updating and storing of the positional-record information for updating in the flash memory 2 is completed.

The sector controlling unit 21 takes in the monitoring-related information of the update-completion monitoring unit 20, and, when the sector controlling unit 21 detects the completion of updating of the positional-record information, the unit 21 outputs a command for eliminating the sector information to the information-elimination controlling unit 22, based on the taken-in monitoring-related information.

When the information-elimination controlling unit 22 receives the command for eliminating the sector information, the unit 22 gives a command in accordance with a pre-determined control procedure to the eliminating unit 24. With an operation for elimination performed by the eliminating unit 24, the information stored in the sector storing the pre-update positional-record information is eliminated. In the first embodiment, the information-elimination controlling unit 22 eliminates the information as an object for elimination in the sector, based on the monitoring-related information of the idle-period monitoring unit 23, which will be described below.

The idle-period monitoring unit 23 has a structure for monitoring whether or not the CPU 8 is in an idle period, that is, whether the CPU 8 is operating or not.

The information-elimination controlling unit 22 momentarily takes in the monitoring-related information of the idle-period monitoring unit 23. Based on the taken-in monitoring-related information, only when the CPU 8 is in an idle period, the unit information-elimination controlling 22 allows the sector information as an object for elimination to be eliminated by the eliminating unit 24.

In this way, by using the idle period of the CPU 8, the information targeted for elimination, which is stored in the sector, is eliminated. Thus, when the idle period continues for a long time and successively, it is possible to eliminate all the information targeted for elimination in the sector in a one-time idle period. However, when a short idle period intermittently occurs, all the information to be eliminated in the sector cannot be eliminated in a one-time idle period, thereby being eliminated by a time-division method.

Figure 2:
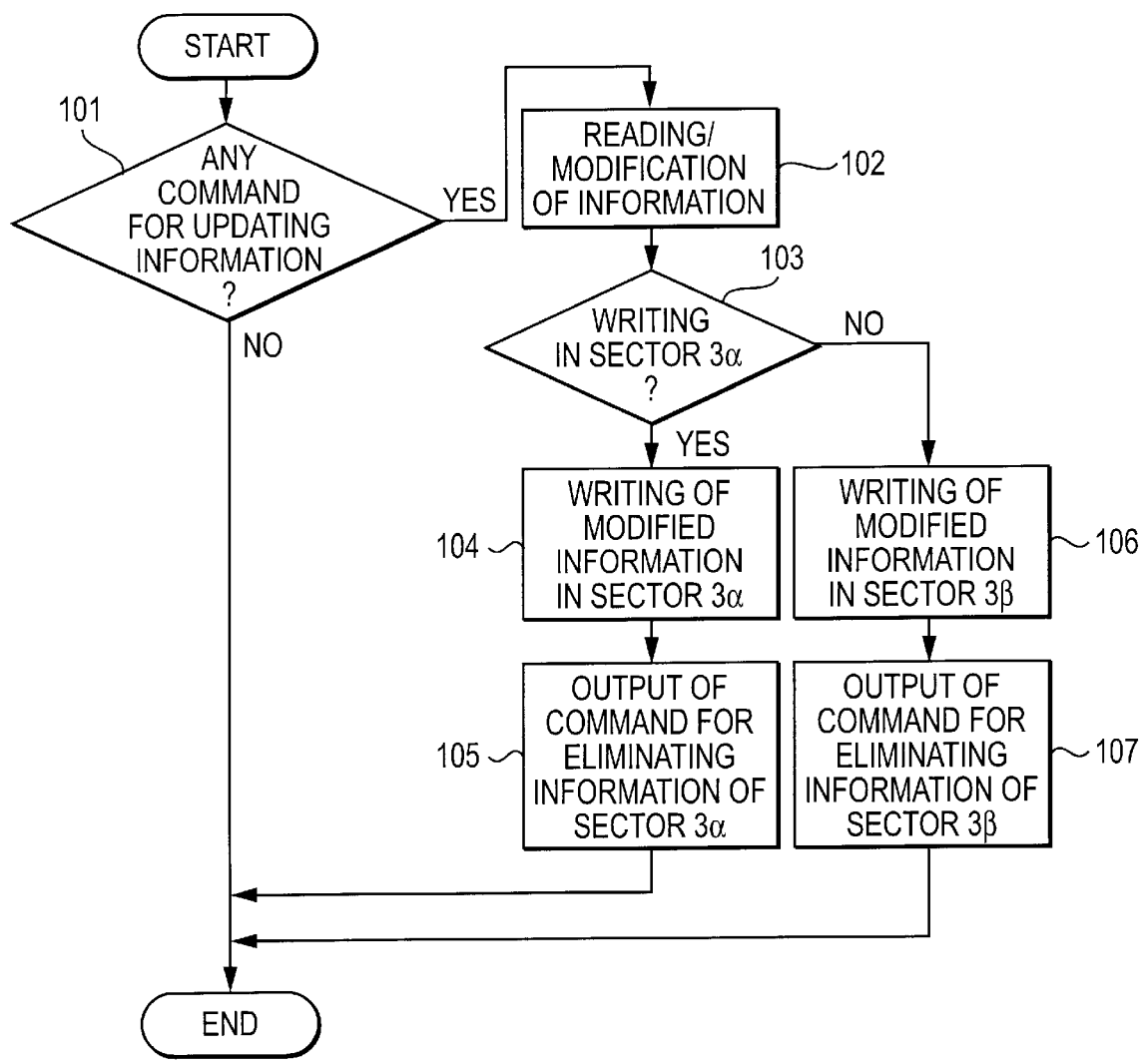
FIG. 2 is a flowchart exemplifying a distinctive operation for updating updatable information in accordance with the first embodiment of the invention.

As described above, FIG. 1 shows the control structure regarding updating and storing of the positional-record information in the flash memory 2 and elimination of the pre-update positional-record information. Next, referring to a flowchart shown in FIG. 2, a brief description will be given of an operational example of updating and storing the positional-record information in the flash memory 2 distinctive in the first embodiment.

First, in step 101, it is determined whether or not a command for updating the positional-record information has been given, and when it is determined that the command has been given, in step 102, all the information in the sector storing the positional-record information is read out from the flash memory 2 and are copied into the RAM 10. In the RAM 10, based on the positional-record information for updating, the positional-record information included in the copied information of the sector is modified.

Next, in step 103, it is determined whether a sector for writing the positional-record information for updating is the sector 3α or not. That is, in step 103, it is determined whether the sector 3α is empty or not.

Then, in step 103, when it is determined that the sector 3α is empty, it is determined that the sector for writing the positional-record information for updating is the sector 3α, and the sector 3α is designated as a sector for writing the information. After this, in step 104, the copied information of the sector, that is the sector 3β, which includes the modified positional-record information, is read out from the RAM 10. The read-out copied information of the sector 3β is updated/stored in the sector 3α. Next, in step 105, a command for eliminating the information stored in the sector, that is the sector 3β, which stores the pre-update positional-record information, is outputted.

In addition, in step 103, when it is determined that the sector 3α stores the positional-record information so that the sector 3α is not empty, it is determined that a sector for writing the positional-record information is not the sector 3α but the sector 3β, and as a result, the sector 3β is designated as a sector for writing the information.

In step 106, the copied information of the sector 3, that is, the information of the sector 3α including the modified positional-record information is read out from the RAM 10, and the read-out information is written into the sector 3β so as to complete updating and storing of the positional-record information. In step 107, a command for eliminating the information stored in the sector 3α where the pre-update positional-record information is stored is outputted.

Figure 3:
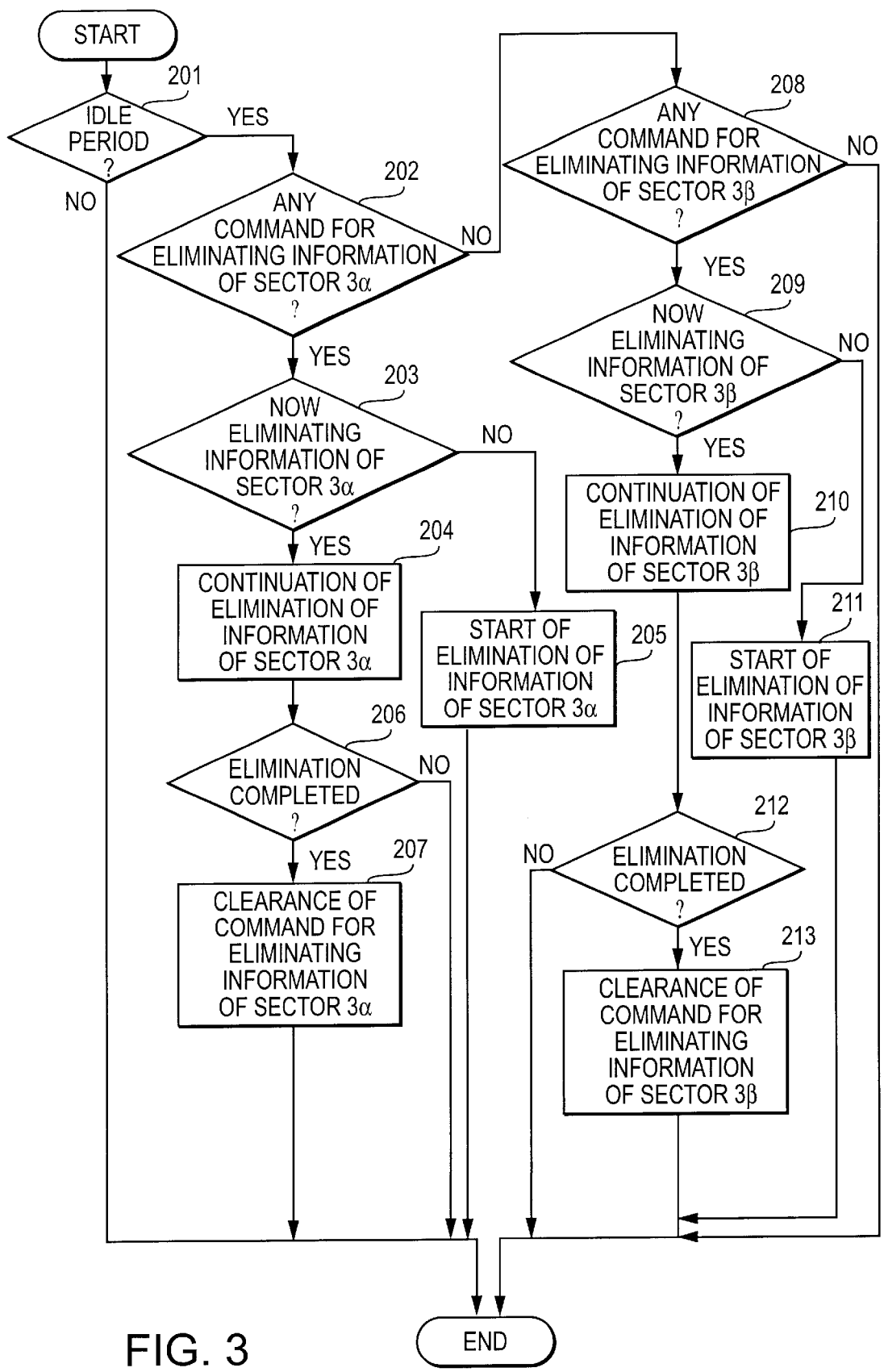
FIG. 3 is a flowchart exemplifying a distinctive operation for eliminating the pre-update updatable information in accordance with the first embodiment of the invention.

With the above operation for updating, the positional-record information is updated. Next, referring to a flowchart shown in FIG. 3, a brief description will be given of an example of eliminating the information of the sector storing the pre-update positional-record information.

First, in step 201, it is determined whether the CPU 8 is in an idle period or not. When it is determined that the CPU 8 is in the idle period, it is determined in step 202 whether a command for eliminating the information stored in the sector 3α has been given or not. Consequently, when it is determined that the command has been given, it is determined in step 203 whether the information of the sector 3α is being eliminated or not.

In step 203, when it is determined that the information of the sector 3α is not being eliminated, elimination of the information stored in the sector 3α is started in step 205. In contrast, when it is determined that the information of the sector 3α is now being eliminated, elimination of the information of the sector 3α is continued in step 204. Next, in step 206, it is determined whether elimination of all the stored information of the sector 3α is completed or not. When it is determined that elimination of the information is completed, the command for eliminating the stored information of the sector 3α is cleared in step 207.

In addition, in step 202, when it is determined that no command for eliminating the information stored in the sector 3α has been given, it is determined in step 208 whether a command for eliminating the information stored in the sector 3β has been given or not. When it is determined that the command has been given, it is determined in step 209 whether the information stored in the sector 3β is now being eliminated or not.

Consequently, in step 209, when it is determined that the information of the sector 3β is not being eliminated, in step 211, elimination of the information stored in the sector 3β is started. Furthermore, in step 209, when it is determined that the information stored in the sector 3β is being eliminated, in step 210, elimination of the information is allowed to be continued. Next, in step 212, it is determined whether elimination of the information is completed or not. When it is determine that elimination of the information is completed, the command for eliminating the information stored in the sector 3β is cleared in step 213.

As described above, when the idle period of the CPU 8 ends during elimination of the information stored in one of the sector 3α and 3β, the operation of eliminating the information stored therein is suspended, and the operation thereof restarts during the next idle period.

In the first embodiment, the two sectors 3α and 3β of the flash memory 2 are allocated as sectors for storing positional-record information. These sectors are controlled such that one of the sectors 3α and 3β stores information including the positional-record information, and the remaining sector stores no information so that it is empty. When positional-record information for updating is given, the information for updating is updated/stored in the empty sector. After the operation of updating/storing is completed, the information stored in the sector storing the pre-update positional-record information is eliminated. With this arrangement, it is unnecessary to eliminate the information of the sector storing the pre-update positional-record information during the period in which updating and storing of the positional-record information for updating into the flash memory 2 is completed after starting updating of the positional-record information. As a result, since the time-consuming processing of eliminating the information of the sector is not required, time necessary for updating the positional-record information can be greatly saved.

Furthermore, since the sector 3 of the flash memory 2 has a limit to the number of times for rewriting the stored information, there is a limit to the number of times for updating the positional-record information of the flash memory 2. However, in the first embodiment, since the positional-record information is written into the two sectors 3α and 3β, alternately, the number of times for updating the positional-record information can be increased almost two times as many as that in the conventional memory having only one sector capable of storing the positional-record information.

In addition, in the above conventional case with only one sector storing positional-record information, a serious problem such as the loss of information can occur, as described below.

For example, in such a conventional apparatus, while the positional-record information included in the copied information of the sector 3 is modified into positional-record information for updating in the RAM 10, the information stored in the sector 3 of the flash memory 2 storing pre-update positional-record information is eliminated to make the sector 3 empty. After this, the copied information of the sector 3 including the modified positional-record information is read out from the RAM 10 to be updated/stored in the aforementioned empty sector. In this procedure for updating the positional-record information, while the information stored in the sector 3 of the flash memory 2 is being eliminated, for example, if the power system of the apparatus is shut down, all the information in the RAM 10 ends up disappearing. As a result, in this case, a part of or almost all of the information stored in the sector 3 storing the positional-record information disappears from the wireless communication apparatus 1.

In contrast, in the first embodiment, since two sectors 3α and 3β are provided for storing the positional-record information. After updating and storing of the positional-record information is completed, the information stored in the sector storing the pre-update positional-record information is eliminated. Therefore, since one of the sectors 3α and 3β necessarily stores all the information to be stored by the sectors, occurrence of the aforementioned serious problem such as the loss of information can be prevented.

Furthermore, in the first embodiment, since the information stored in the sector storing the pre-update positional-record information is eliminated during the period of idleness of the CPU 8, there is no need to take time for eliminating the information stored in the sector. The information targeted for elimination in the sector 3 can be eliminated by using the period in which no other processing is being performed. As a result, this arrangement permits the CPU 8 to work efficiently.

Now, a description will be given of a second embodiment of the present invention. In the second embodiment, three or more sectors are allocated for storing positional-record information, unlike the first embodiment. The other structural parts shown in the second embodiment are almost the same as those shown in the first embodiment, and the explanation of the same parts is thereby omitted.

As mentioned above, in the second embodiment, three or more sectors of a plurality of sectors 3 contained in a flash memory 2 are allocated as sectors for storing the positional-record information. In this case, for example, each of the plurality of sectors allocated for storing the positional-record information sequentially stores the positional-record information for updating in a pre-determined order.

According to the second embodiment, since the three or more sectors for storing the positional-record information are allocated, the number of times for updating the positional-record information can be further increased than in the case of the first embodiment.

In addition, similar to the case of the first embodiment, when two sectors 3α and 3β are allocated for storing the positional-record information, during a period in which the information stored in the sectors storing pre-update positional-record information is being eliminated, that is, during a period in which either the sector 3α or 3β is not empty, there is a possibility that positional-record information for the next updating may be given. However, as shown in the second embodiment, in the case of three or more sectors allocated for storing the positional-record information, when the positional-record information for updating is given, it is almost possible to keep at least one of the plurality of the sectors allocated for storing the positional-record information empty. Thus, it is substantially possible to avoid the aforementioned problem in that no empty sector is available when the positional-record information for the next updating is given.

Naturally, as shown in the first embodiment, when the two sectors are allocated for storing the positional-record information, there is almost no possibility that the next positional-record information for updating is given in the period in which the positional-record information for updating is stored in one of the sectors stores, and then, elimination of the information stored in the other sector is completed. Therefore, as described in the embodiment, even when the two sectors are allocated for storing the positional-record information, the problem described above almost never occurs.

Furthermore, the present invention is not restricted to only the embodiments described above, and various modifications and changes can be made within the scope of the invention. For example, in each of the embodiments above, every time the positional-record information is updated, necessarily, as a first step for updating processing, the information of the sector storing the positional-record information is read out from the flash memory 2 to be copied into the RAM 10. In this case, the first step for updating processing is performed when the positional-record information is updated for the first time, that is, only when no copied information of the sector storing the positional-record information is stored in the RAM 10, with result that the positional-record information of the flash memory 2 is updated. However, after the first-time updating of the positional-record information is completed, that is, when the copied information of the sector including the positional-record information is stored in the RAM 10, copying of the information of the sector into the RAM 10 from the flash memory 2 is not performed any more. Instead, from the beginning, modification of the positional-record information may be performed in the RAM 10 to update/store the positional-record information into the empty sector, as described above.

Even when the positional-record information of the flash memory 2 is updated by this process, a s shown in each embodiment above, by providing an empty sector, there is no need to perform elimination of the information stored in the sector, which is a time-consuming processing, during the period between the start of updating of the positional-record information in the flash memory and the completion of updating the information. As a result, time necessary for updating the positional-record information can be greatly reduced.

Furthermore, in each of the above embodiments, updating of the positional-record information has been described as an example. However, for example, similarly, regarding other updatable information such as area information, by controlling updating/storing of the information in the flash memory and elimination of pre-update information as in the cases of the above embodiments, the same advantages as those shown in the above embodiments can be obtained.

Furthermore, in the above embodiments, the RAM 10 is used for updating the positional-record information. However, as an alternative to the RAM 10, a memory contained in the CPU 8 may be used for updating the positional-record information as in the cases of the embodiments.

In addition, in the embodiments, the positional-record information for updating is updated/stored in a single empty sector. However, the information may be updated/stored in two or more empty sectors.

As described above, according to the present invention, with the sector controlling unit, the arrangement is 1provided such that one of the plurality of sectors in the flash memory stores updatable information, and at least one of the remaining sectors has no information so that the sector is empty. After receiving the command for updating the updatable information, the update controlling unit updates/stores the updatable information for updating in a specified empty sector of the plurality of sectors. After updating/storing of the updatable information is completed, the information-elimination controlling unit eliminates the information stored in the sector storing the updatable information before being updated to make the sector empty. With this arrangement, by the time updating and storing of the updatable information for updating is completed after receiving the command for updating the updatable information, it is unnecessary to eliminate the information stored in the sector so as to make the sector empty. Therefore, since it is unnecessary to perform the time-consuming processing of elimination of the information stored in the sector, time required between the start and completion of updating the updatable information can be greatly reduced.

Furthermore, since the sector of the flash memory has a limit to the number of times for being written therein, there is also a limit to the number of times for updating the updatable information of the flash memory. However, in the present invention, since the updatable information is updated/stored into the plurality of sectors in order, the number of times for updating the updatable information can be significantly increased, as compared with that in the conventional case where only one sector is allocated for storing the updatable information.

Furthermore, the invention provides such an arrangement that, after updating and storing of the updatable information for updating is completed, the information stored in the sector storing the pre-update information is eliminated. Therefore, for example, even if the power system is shut down, a serious problem such as disappearance of a part of the information stored in the flash memory can be prevented without fail.

In terms of updatable information such as positional-record information and area information concerning the wireless communication apparatus, positional-record information and area information tend to be more frequently updated than other information. Therefore, it is significantly advantageous to use the distinctive arrangement of the present invention.

Since the information-elimination controlling unit of the invention eliminates the information stored in the sector as an object targeted for elimination by using the period of idleness of the wireless communication apparatus, there is no need to take time for eliminating the information of the sector, and elimination of the information of the sector is performed during the idle period of the apparatus. As a result, this permits the control unit of the wireless communication apparatus to efficiently work.

What is claimed is:

1. A wireless communication apparatus comprising:
 a non-volatile flash memory, in which a plurality of sectors capable of storing one or more pieces of information are formed to be partitioned;
 a sector controlling unit for controlling the sectors in such a manner that at least one of the plurality of the sectors stores updatable information, and at least one of the remaining sectors stores no information so that the at least one of the remaining sectors becomes empty;

an update controlling unit for updating/storing the updatable information in a specified empty sector of the plurality of sectors after receiving a command for updating the updatable information; and an information-elimination controlling unit which eliminates the information stored in the said specified sector based on a command given from the sector controlling unit so as to make the sector empty, directly following and in response to updating and storing of the updatable information.

2. A wireless communication apparatus according to claim 1, further comprising:

an information reading unit for reading out all the information stored in the sector where the updatable information as an object to be updated is stored, based on a command from the update controlling unit, when the command for updating the updatable information is received;

an information modifying unit for modifying the read-out updatable information; and an information writing unit for updating/storing the information including the modified updatable information stored in the sector into a specified empty sector of the plurality of sectors.

3. A wireless communication apparatus according to claim 2, wherein the updatable information is one of positional-record information and area information concerning the wireless communication apparatus.

4. A wireless communication apparatus according to claim 3, wherein the information-elimination controlling unit eliminates the information stored in the sector targeted for information elimination during an idle period in which the wireless communication apparatus is not performing information processing.

5. A wireless communication apparatus according to claim 2, wherein the information-elimination controlling unit eliminates the information stored in the sector targeted for information elimination during an idle period in which the wireless communication apparatus is not performing information processing.

6. A wireless communication apparatus according to claim 1, wherein the information-elimination controlling unit eliminates the information stored in the sector targeted for information elimination during an idle period in which the wireless communication apparatus is not performing information processing.

7. A wireless communication apparatus according to claim 1, wherein the updatable information is one of positional-record information and area information concerning the wireless communication apparatus.

8. A wireless communication apparatus according to claim 7, wherein the information-elimination controlling unit eliminates the information stored in the sector targeted for information elimination during an idle period in which the wireless communication apparatus is not performing information processing.

* * * * *